United States Patent [19]

Delacourt et al.

[11] Patent Number: 5,160,991
[45] Date of Patent: Nov. 3, 1992

[54] ELECTROMAGNETIC WAVE DETECTOR AND IMAGE ANALYZER COMPRISING A DETECTOR OF THIS TYPE

[75] Inventors: Dominique Delacourt, Paris; Michel Papuchon, Massy; Jean-Paul Pocholle, Arpajon, all of France

[73] Assignee: Thomson-CSF, Paris, France

[21] Appl. No.: 764,096

[22] Filed: Sep. 23, 1991

Related U.S. Application Data

[63] Continuation of Ser. No. 219,363, Jul. 15, 1988, abandoned.

[30] Foreign Application Priority Data

Jul. 17, 1987 [FR] France ............... 87 10121

[51] Int. Cl.$^5$ ............... H01L 27/14; H01L 31/04; G02B 6/12
[52] U.S. Cl. ............... 250/338.4; 257/21; 257/14; 385/14
[58] Field of Search ............... 357/16, 4, 30; 350/96.11–96.14; 250/338.4

[56] References Cited

U.S. PATENT DOCUMENTS

| | | | |
|---|---|---|---|
| 4,507,519 | 3/1985 | Kazumi et al. | 357/30 |
| 4,508,966 | 4/1985 | Oberschmid et al. | 250/327.2 L |
| 4,620,214 | 10/1986 | Margalit et al. | 357/30 |
| 4,795,225 | 1/1989 | Sakai et al. | 357/30 |
| 4,831,428 | 5/1989 | Yamaka | 357/30 |

FOREIGN PATENT DOCUMENTS

| | | |
|---|---|---|
| 0131437 | 1/1985 | European Pat. Off. |
| 0133342 | 2/1985 | European Pat. Off. |
| 0183146 | 6/1986 | European Pat. Off. |
| 0206117 | 12/1986 | European Pat. Off. |
| 8403363 | 8/1984 | World Int. Prop. O. |

OTHER PUBLICATIONS

Applied Physics Letters, vol. 40, No. 1, Jan., 1982, pp. 38–40, American Institute of Physics, New York, US; F. Capasso, et al.
Applied Physics Letters, vol. 45, No. 9, Nov., 1984, pp. 919–921, American Institute of Physics, New York, US; Y. Horikoshi, et al.
Patent Abstracts of Japan, vol. 9, No. 110, (E-314) [1833], May 15, 1985; & JP-A-60 785 (Nippon Denshin Denwa Kosha) May 1, 1985.
Leighton, *Principles of Modern Physics*, McGraw-Hill N.Y. 1959 pp. 152–154.

*Primary Examiner*—Jerome Jackson, Jr.
*Attorney, Agent, or Firm*—Oblon, Spivak, McClelland, Maier & Neustadt

[57] ABSTRACT

The detector can be used to detect a wave in the medium infrared range by controlling the detector through optical pumping by means of a near infrared wave. In this case, the detector has a quantum well structure consisting of alternating first layers and second layers, these materials being such that there is a potential well in the conduction band and the valence band of each first layer. The thickness of each first layer is such that the electrons of the conduction band have at least one permitted discrete level of energy, such that the difference in energy between this level and the bottom of the conduction band in the second layers is smaller than or equal to the energy corresponding to the frequency of the wave to be detected; and such that the difference in energy between the fundamental level permitted for the holes in the valence band and the fundamental level permitted for the electrons in the conduction band corresponds to a frequency close to the frequency of the control wave.

5 Claims, 7 Drawing Sheets

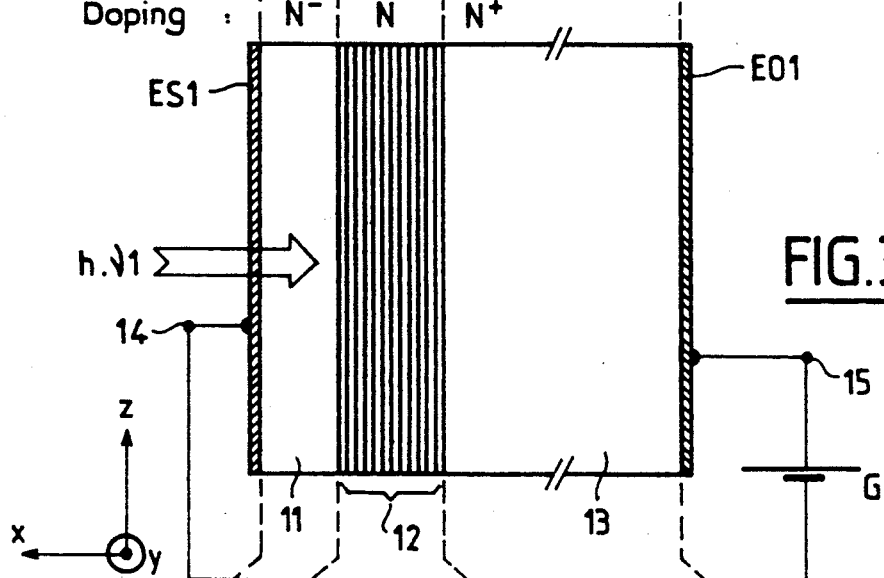
FIG. 3a
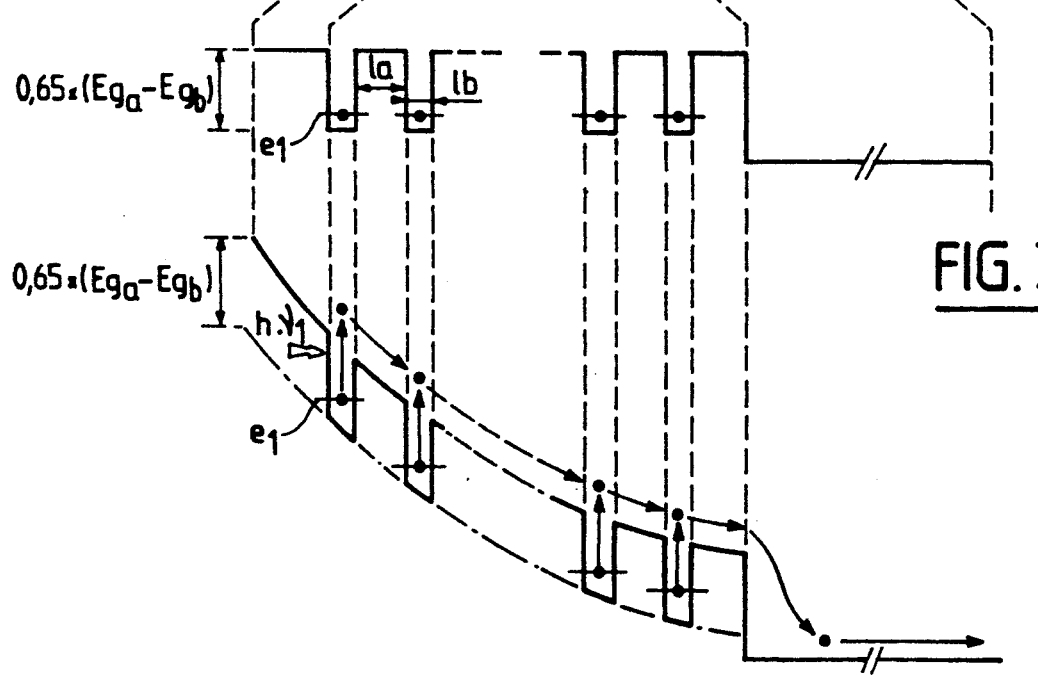
FIG. 3b
FIG. 3c

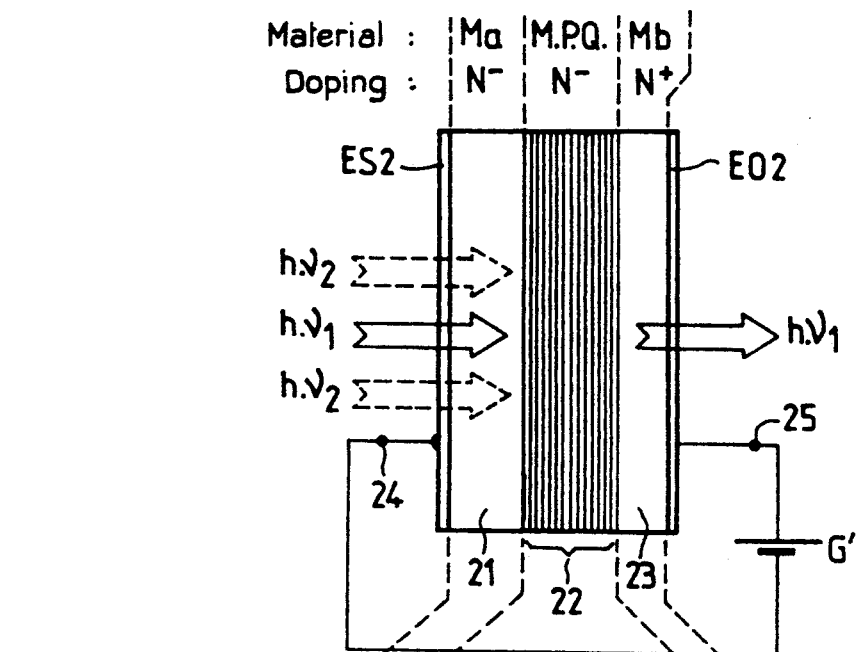
FIG. 4a
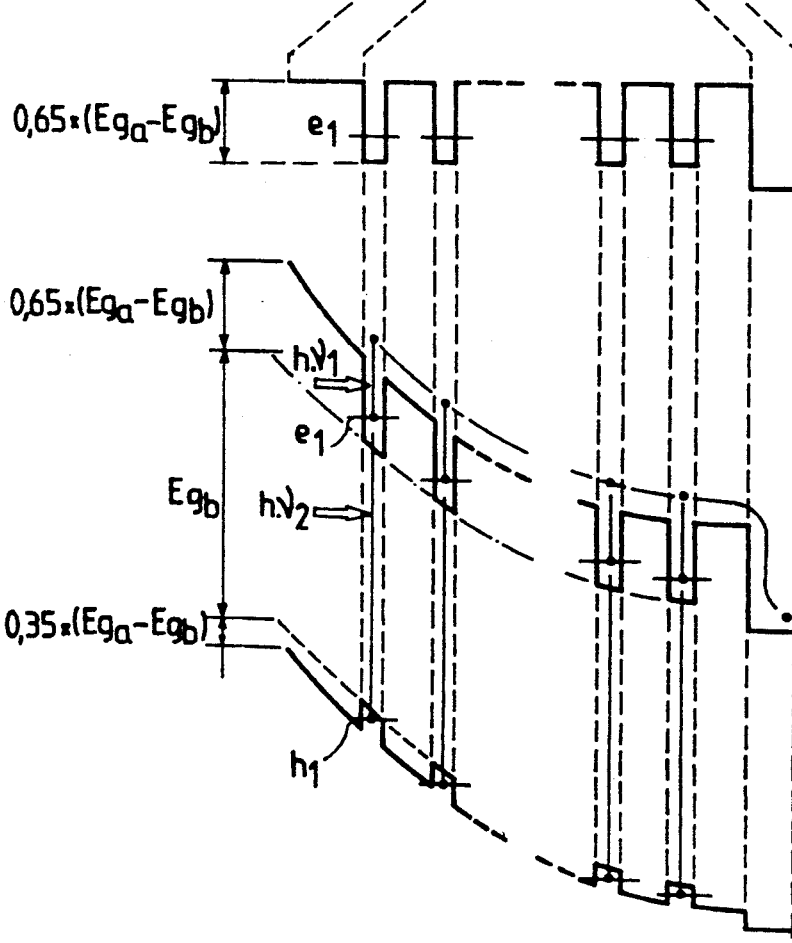
FIG. 4b
FIG. 4c

ELECTROMAGNETIC WAVE DETECTOR AND IMAGE ANALYZER COMPRISING A DETECTOR OF THIS TYPE

This application is a continuation of application Ser. No. 07/219,363, filed on Jul. 15, 1988, now abandoned.

BACKGROUND OF THE INVENTION

1. Field of the Invention

The invention concerns an electromagnetic wave detector, especially to detect and measure the amplitude of an optical wave in a semiconducting material and an image analyzer comprising a detector of this type.

2. Description of the Prior Art

In infrared wave applications, there are two types of detectors known: pyroelectrical detectors which can work at ambient temperature but are slow and detectors with absorption by a type II-VI semiconducting material. These latter detectors are based on the absorption of the wave to be detected by a transition of electrons from the valence band to the conduction band of the semiconducting material. The free electrons thus created are then collected and drained by an electrical circuit. The measurement of the corresponding current enables the measurement of the optical power received by the detector. These devices should therefore consist of semiconducting materials for which the bandgap is smaller than the energy corresponding to the wave to be detected. This fact leads to the use of II-VI semiconducting materials which are presently very difficult to manufacture. Furthermore, it is not possible to make optical guides and a standard detector with one and the same semiconducting material since the guide should be made with materials transparent to the wave to be propagated while a standard detector requires the use of a semiconducting material that absorbs this very same wave. It is therefore not possible, in integrated optics, to make a low-loss guide and a detector on one and the same semiconductor substrate.

The aim of the invention is to propose a detector made of semiconducting materials which can be manufactured by simpler manufacturing techniques and enables the integration of the optical guides and a detector on one and the same substrate.

SUMMARY OF THE INVENTION

An object of the invention is a detector comprising a special quantum structure enabling the detection of a wave within a semiconducting material which is usually transparent to the frequency of this wave. For example, it may be made of type III-IV semiconducting materials to detect a wave in the medium infrared range. Two alternative embodiments of this detector are proposed:

according to a first alternative, this quantum structure systematically absorbs the wave to be detected and, therefore, cannot be subject to controls;

according to a second alternative, the absorption of the semiconducting material can be controlled in the course of time or locally, by optical pumping, using a control wave with a frequency which is generally far higher than the frequency of the wave to be detected. For example, the control wave may be in the near infrared range while the wave to be detected is in the medium infrared range. The detector may then be absorbent at certain moments, or at certain points of its detection surface and may be transparent at other moments or at other points.

Another object of the invention is an image analyzer comprising a detector according to this second alternative.

According to the invention, an electromagnetic wave detector to detect a wave with a frequency of $\nu_1$ comprises:

at least one first layer of semiconductive material of a first type which is crossed by the wave to be detected;

at least two second layers, each first layer being placed between two second layers and these second layers consisting of a semiconducting material of a second type, these two types of material being such that there is a potential well in the conduction band and in the valence band of each first layer; the thickness of each first layer being such that the electrons of the conduction band of each first layer have at least one permitted discrete level of energy such that the difference in energy between this layer and the bottom of the conduction band in the second layers is smaller than or equal to the energy corresponding to the frequency $\nu_1$ of the wave to be detected; said level being populated by electrons;

two electrodes to apply an electrical field to all the first and second layers and to collect an electrical current depending on the amplitude of the wave to be detected.

BRIEF DESCRIPTION OF THE DRAWINGS

The invention will be better understood and other details will emerge from the following description and the accompanying figures, of which:

FIGS. 3a, 3b and 3c show a first embodiment of the detector according to the invention, according to the first alternative;

FIGS. 4a, 4b and 4c show a second embodiment of a detector according to the invention in accordance with the second alternative;

DESCRIPTION OF PREFERRED EMBODIMENTS

Figure 1:
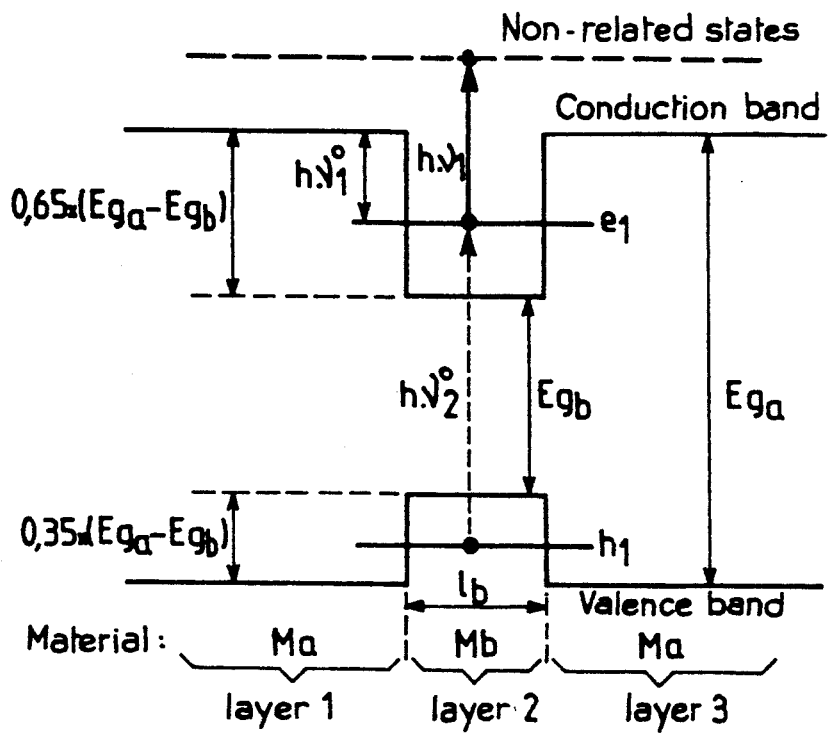
FIG. 1 shows a graph of the energy levels of the carriers in the quantum structure comprised by the detector according to the invention.

The graph of FIG. 1 shows the energy levels of the carriers in the quantum structure used in the detector according to the invention. This quantum structure comprises: a layer 2 of a first type of semiconducting material, $M_b$, and two layers, 1 and 3, of a second type of semiconducting material, $M_a$, located on either side of the layer 2. The layers 1 and 3 have a bandgap $E_{ga}$ while the layer 2 has a bandgap $E_{gb}$ smaller than $E_{ga}$. It is generally taken that the difference between these two widths is distributed between the conduction band and the valence band in the proportions of 65% and 35% respectively.

The association of these three layers of semiconducting materials, having different bandgap widths, enables the creation of a potential well for the electrons in the conduction band and the holes in the valence band. When the dimensions of these wells are close to the de Broglie wavelengths associated with these particles, the total energy allowed to them can assume only a finite number of discrete values. This number of values and these values are directly related to the dimensions of the quantum wells and to the characteristics of the semiconducting material. The quantal structure used in the detector according to the invention has only one dimension: the thickness $l_b$ of the layer 2. The wells thus have at least one permitted level of discrete energy $e_l$ for the electrons in the conduction band and at least two levels $h_1$ and $h_2$ for the holes in the conduction band. To simplify the explanation, in this figure, all the holes of the valence band are assumed to have the same characteristics, thus resulting in the existence of only two permitted discrete energy levels $h_1$ and $h_2$.

If the level $e_1$ is populated with electrons, a wave with a frequency $\nu_1$ can be detected and absorbed by a transition from the level $e_1$ towards the continuum of non-related states located above the potential barrier, provided that the energy $h \cdot \nu_1$ of the wave to be detected, h being Planck's constant, is greater than an energy value of $h \cdot \nu_1^0$ equal to the potential barrier, i.e. equal to the energy difference between the fundamental level $e_1$ permitted for the electrons in the conduction band of the layer 2 and the bottom of the conduction in the layers 1 and 3. For the fundamental level $e_l$ of the conduction band of the layer 1 to be populated with electrons, two alternative embodiments are possible.

In a first embodiment, the layer 2 consists of a rather highly doped semiconductive material, doped with an N-type dopant, to enable detection without the detector being saturated. The wave to be detected is then systematically absorbed. According to a second alternative, the layer 2 consists of a non-doped semiconducting material, namely a material having a residual doping that is as low as can be achieved with known technologies. The fundamental level $e_1$ is then populated by optical pumping, in illuminating the layer 2 by a wave with a frequency $\nu_2$, close to the frequency $\nu_2^0$, corresponding to the energy difference between the fundamental level $h_1$ permitted for the holes in the valence band and the permitted fundamental level $e_1$ for the electrons in the conduction band of the material of the layer 2. The absorption of the wave to be detected, with a frequency $\nu_1$, then cannot be made unless the control wave, with a frequency $\mu_2$, eliminates the layer 2.

The frequency $\nu_2$ is greater than the frequency $\nu_1$ because of the configuration of the energy levels in the layer 2, and may belong to a spectral range which is very different from that of $\nu_1$. For example, the wave to be detected may be in the medium infrared range while the control wave may be in the near infrared range. In the absence of the control wave, the layer 2 is perfectly transparent. The layers 1 and 3 are also made of a semiconducting material with little or no doping, thus make it possible to obtain a detector transparent to the wave to be detected to be obtained when there is no control wave. This detector may be inserted in the path of the wave to be detected without causing it to disappear for as long as it has not been commanded to perform the detection. This property of the detector according to the invention is an advantage as compared with standard detectors which absorb the wave to be detected as soon as they are placed in the path of this wave. Furthermore, the detector according to the invention can be integrated into an optical guide to measure the optical power at certain instants without disturbing the propagation of light for the rest of the time.

Finally, it is possible to illuminate only a very small portion of the surface of the layer 2 in order to detect the optical power at a precise point of this layer, to analyze the optical power going through this layer point by point. This structure thus makes it possible to prepare an image analyzer with optical scanning or a device for the point by point measurement of the optical power in an optical guide.

The principle of operation of the detector according to the invention enables the use of types III–V semiconducting materials, especially alloys of the $Al_xGa_{1-x}As$ type for which the technology is a very standard one.

Figure 2:
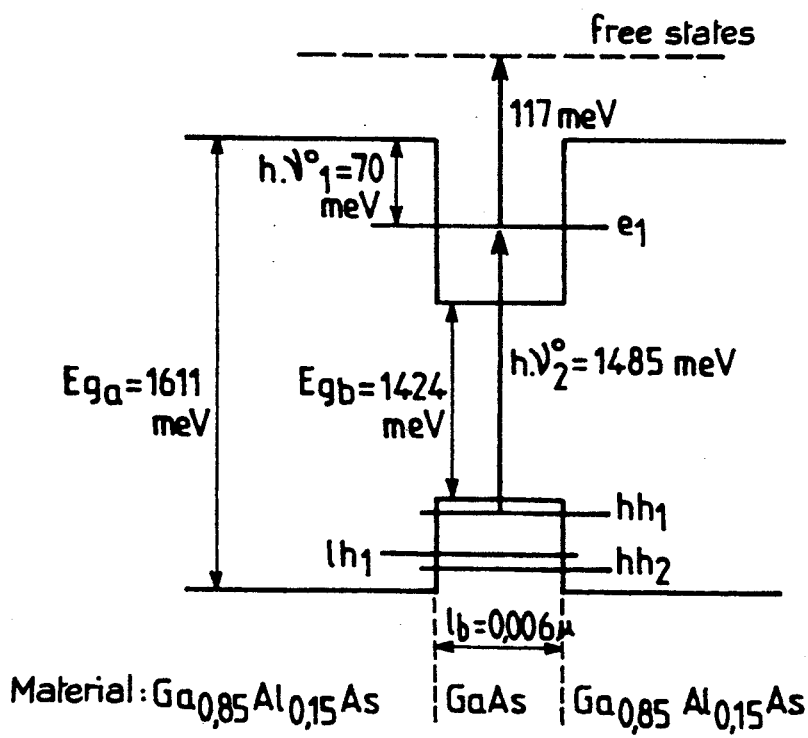
FIG. 2 shows a graph of the energy levels of the carriers in this quantum structure for an example relating to the choice of semiconductive materials.

FIG. 2 shows a graph similar to that of FIG. 1, for an embodiment designed to detect a wave with a wavelength of 10.6 microns, corresponding to an energy level of 117 meV, when the detector is illuminated by the control wave. The layers 1 and 3 consist of $Ga_{0.85}Al_{0.15}As$ and the layer 2 consists of GaAs. For these materials, $E_{ga}$ is equal to 1611 meV and $E_{gd}$ is equal to 1424 meV. For a thickness of $l_b = 0.006$ microns, the permitted energy levels are such that the transition from the fundamental level $e_1$ to the lowest level of the conduction band in the layers 1 and 3 is equal to 70 meV.

With these materials, the thickness $l_b$ of the layer 2, constituting the quantum well, should be smaller than 0.0068 microns so that the electrons have only one permitted level of discrete energy in the conduction band. Furthermore, for the detector to be capable of working at ambient temperature, the potential barrier to be crossed for the electrons, which has a value $h \cdot \nu_1^0$, should be greater than $k.T = 26 meV$, k being the Boltzmann constant, T being equal to 300° K. Finally, the height of this barrier should be lower than 117 meV so that it is possible to detect a wavelength of 10.6 microns. Consequently, the value $h \cdot \nu_1$ should range between 26 and 117 meV. In this example, the choice of the materials and the choice of a width $l_b = 0.006$ microns leads to a height of the potential barrier equal to 70 meV which is suitable for absorbing the configuration of the wave to be detected, namely 10.6 microns.

The heavy holes have two permitted levels of energy $hh_1$ and $hh_2$ while the light holes have a single permitted level, $lh_1$, in the valence band of the layer 2. The energy difference $h \cdot \nu_2^0$ between the fundamental level $hh_1$ for the holes in the valence band and the fundamental level $e_1$ for the electrons in the conduction is equal to 1485 meV, corresponding to a wavelength of 0.93 microns belonging to the very near infrared range. The existence of two groups of holes, light holes and heavy holes, as well as the existence of two permitted levels for the heavy holes does not change the operating principle of the above described detector with reference to FIG. 1.

FIG. 3a gives a schematic view of a first embodiment of a detector according to the invention, in accordance with the first alternative, to detect a non-guided wave marked $h \cdot \nu_1$. This embodiment has a Schottky electrode ES1, a layer 11 consisting of a material $M_a$: a set of layers 12 known as quantum multiple well layers (M.P.Q.) and consisting of a periodic sequence of layers of material $M_a$ with a thickness $1_a$ and layers of material $M_b$ with a thickness $1_b$; a layer 13 consisting of material $M_b$; and an ohmic electrode EO1. The electrode ES1 is connected by a terminal 14 to an electrical circuit having a DC voltage generator G. The electrode EO1 is connected by a terminal 15 to this same electrical circuit.

The wave to be detected, $h \cdot \nu_1$, is applied perpendicularly to the layers, through the ES1 which is made so as to be transparent to the frequency $\nu_1$. For this purpose, various embodiments are possible: a very small thickness or a grid structure, etc. The layer 11 has an N-type residual doping which should be the smallest possible doping that can be made in known technology so as not to absorb the frequency $\nu_1$ wave. The layers of the set 12 have an N-type doping to populate the permitted level $e_1$ of the quantum wells with electrons sufficiently for there to be no saturation of the detector by the wave to be detected. However, this doping should be compatible with the limit voltage which can be supported by the electrode ES1 and which governs the maximum electrical field applicable within the layers 12 and 13. The layer 13 constitutes the substrate of the detector and has very high N-type doping in order to make it easier to obtain an ohmic nature for the electrode EO1.

In this embodiment, since the wave to be detected is absorbed by all the layers 12, the electrode EO1 may be not transparent for the frequency $\nu 1$. The layers of the set 12 are similar to the layers 1, 2, 3, described above with reference to FIGS. 1 and 2. There may be 100 of these layers for example. The thicknesses $1_1$ and $1_b$ are such that the quantum wells formed in the layers of material $M_b$ have properties identical to those described above. The thickness $1_a$ of the potential barriers between the quantum wells is chosen so that it is large enough to prevent coupling between these wells, i.e. it is chosen so that the state of an electron in a well is independent of the state of the electrons in the other wells. The thickness $1_b$ is chosen so that the quantum wells have at least one permitted level of discrete energy in the conduction band. The multiplicity of the number of wells has the effect of increasing the number of electrons available on the fundamental level $e_1$, thus pushing back the saturation threshold of the detector. The thickness of the layer 1 is not critical because its only role is to protect the quantum well of the last layer of material $M_b$ of the set 12, on the electrode ES01 side.

FIGS. 3b and 3c show graphs of the energy levels of electrons in the various layers of this embodiment, respectively when no potential difference is applied to the terminals 14 and 15 and when a positive potential difference is applied to the terminal 15 as compared with the terminal 14, namely, when the device is reverse biased to detect and collect the electrons that have transisted from the fundamental level $e_1$ towards the continuum of the non-related states. A low electrical field due to the Schottky electrode has been overlooked and is not shown. In these figures, the electrons are depicted by a black dot. Their fundamental level is shown by a horizontal line and their displacement is represented by an arrow.

In FIG. 3b, each layer of the set of layers 12 has a quantum well comprising electrons at the fundamental level $e_1$. In FIG. 3c, the electrical field created by the generator G is at its maximum at the interface between the electrode ES1 and the layer 11 since it decreases from the electrode ES1 to the electrode EO1. When a wave $h \cdot \nu_1$ is absorbed, the electrons cross the potential barrier of the quantum wells, are shifted by the electrical field, created by the generator G, and constitute a current with an intensity which can be measured and represents the optical power detected.

FIG. 4a gives a schematic view of a second embodiment of the detector according to the invention, to detect a non-guided wave according to the second alternative embodiment. A control wave $h \cdot \nu_2$ is applied at the same time as the wave to be detected $h \cdot \nu_1$, in a direction perpendicular to the plane of the layers constituting the detector. When there is no control wave $h \cdot \nu_2$, the wave $h \cdot \nu_1$ crosses the device and leaves practically without weakening. This embodiment comprises a Schottky electrode ES2, transparent both to the wave to be detected and to the control wave; a layer 21 made of the material $M_a$; a set of layers 22 constituting a quantum multiple well: a layer 23 consisting of material $M_b$ and an ohmic electrode E02. The electrodes ES2 and E02 are respectively connected to two terminals 24 and 25 which make it possible to connect an electrical circuit comprising a generator G' to shift and collect the electrons that have transisted from the level $e_1$ towards the continuum of free states. The intensity of the current flowing in this circuit makes it possible to measure the optical power detected.

In this embodiment, the material $M_a$ of the layer and the materials $M_a$ and $M_b$ of the set of layers have an N-type doping which, however, is the smallest doping that can be achieved by known technology to reduce the absorption of the frequency $\nu_1$ wave to the minimum in the absence of the control wave. The layer 23 constitutes the substrate of the detector and has a very high N-type doping, as with the first embodiment, but its thickness should be reduced to minimize the absorption of the frequency $\nu_1$ wave and to enable it to come out of the detector when there is no control wave $h \cdot \nu_2$. For the same reason, the ohmic electrode E02 is made so as to be transparent to the wave $\nu_1$.

FIG. 4b shows a graph of the energy levels of the carriers in the various layers of this embodiment when there is no potential difference applied between the terminals 24 and 25. The set of layers 22 has several quantum wells in which the fundamental level $e_1$ is deserted in the absence of a control wave $\nu_2$.

FIG. 4c shows a graph of the energy levels of the carriers in the conduction band and the valence band through the layers of this embodiment when a positive potential difference is applied to the terminal 25 with respect to the terminal 24 and when the control wave $h \cdot \nu_2$ illuminates the detector. The existence of a weak electrical field, due to Schottky effect, in the vicinity of the electrode ES2, has been overlooked and is not shown in this figure. The electrical field created by the electrodes ES2 an E02 is maximum at the interface ES2 and the layer 21, and then decreases in the direction of the electrode E02. The reverse biasing should be such that the zone of the application of the field covers the totality of the layers 22 and 23.

When the control wave $\nu_2$ is applied, electrons transit from the permitted level $h_1$ of the valence band to the level $e_1$ in the conduction band in each quantum well. The energy needed for this transition is provided by the control wave. The electrons that thus populate the level $e_1$ in each quantum well transit towards the continuum of non-related states under the effect of the wave to be detected $h \cdot \nu_1$ and are then carried by the electrical field and collected by the electrode E02.

Figure 5:
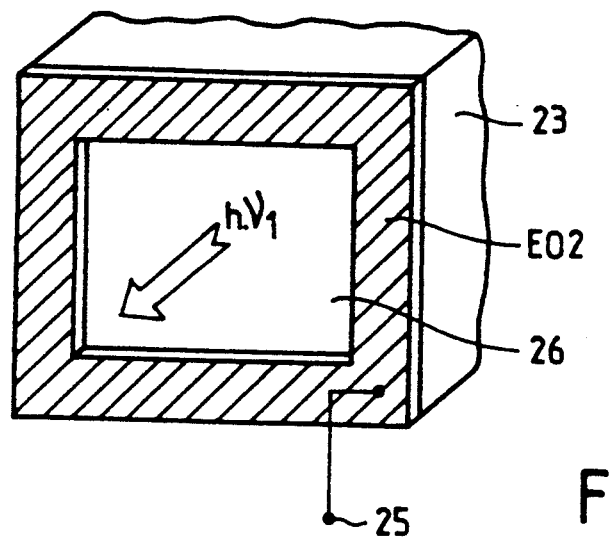
FIG. 5 shows a part of the second embodiment.

FIG. 5 shows a part of this second embodiment. To make an electrode E02 that covers the entire surface of the layer 23 but is transparent to the frequency $\nu_1$ wave when it is not absorbed by the detector, it is possible to use an electrode E02 which is not transparent but does not cover the entire surface of the layer 23. The electrode E02, shown in FIG. 5, covers only the edge of the external surface of the layer 23. A window 26 leaves the greater part of the surface of the layer 23 free and lets through the frequency $\nu_1$ wave. The high doping of the layer 23, nonetheless, makes it possible to obtain a relatively uniform electrical field inside the detector.

Figure 6:
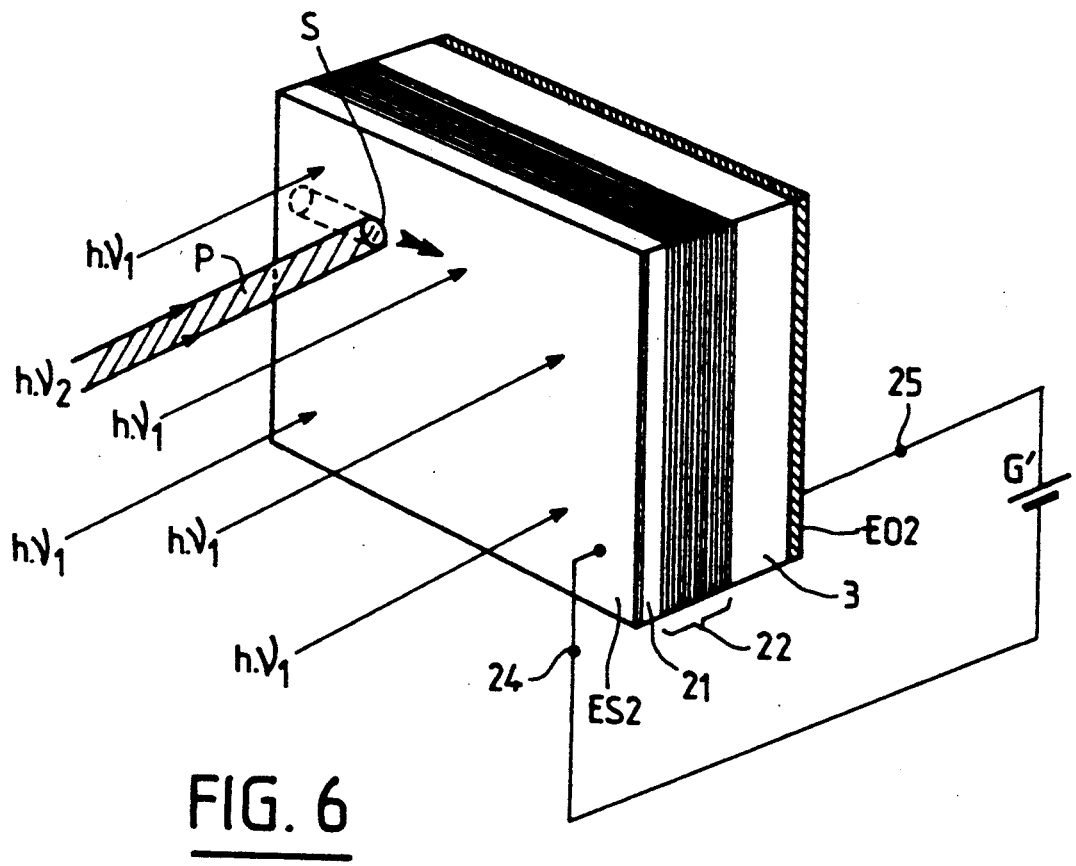
FIG. 6 shows an embodiment of an image analyzer comprising a detector according to the invention.

The embodiment shown in FIG. 4a can be used to form an image analyzer. FIG. 6 shows a use of this type. Light rays with a frequency $\nu_1$ at least equal to $\nu_1$, which are carriers of an image, are projected on the electrode ES2 by a standard optical device (not shown), for example a lens. They go through the electrode ES2 and the layer 21 and then form an image on the set 22 of layers forming the quantum multiple well. A pencil P of light with a frequency $\nu_2$ is projected on the electrode ES2 by standard optical scanning means (not shown). The beam P scans the surface of layers 22 along a predetermined path and performs systematic scans of the entire surface of these layers. The resolution of the image analyzing device thus formed is related to the dimension of the light spot S created by the beam on the surface of the layers 22, to the length of diffusion of the electrons in the direction of the plane of the layers and to the diffraction in the layer 21.

The possibility of using a control wave with a frequency of $\nu_2$ belonging to a range of wavelengths which is quite different from the range of wavelengths to be detected enables, for example, the analysis of an image, in the near to medium infrared range, of a beam belonging the medium infrared range using III-V type semiconducting materials and, especially, alloys of the $AL_x Ga_{1-x}As$, of a standard technology.

Figure 7:
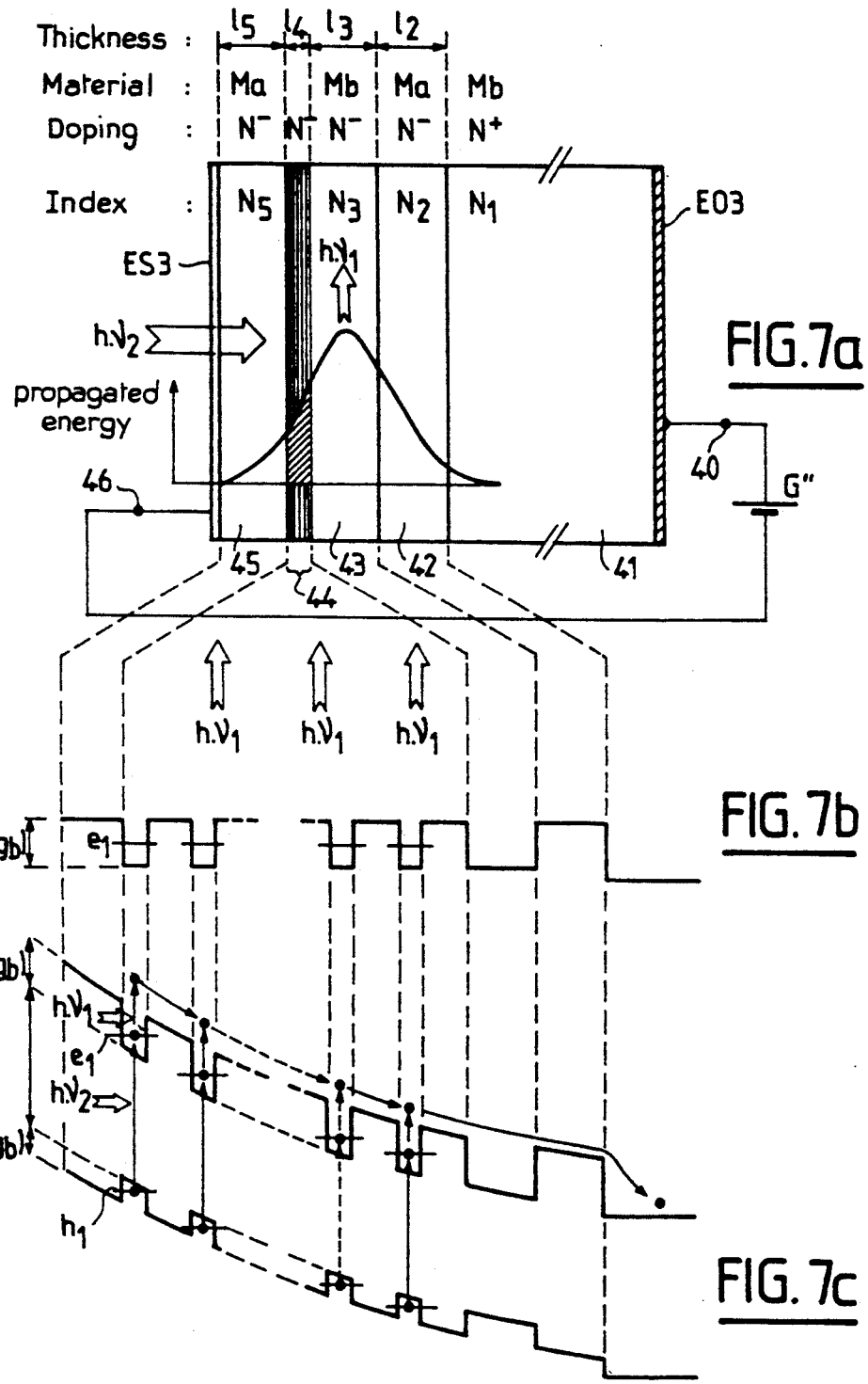
FIGS. 7a, 7b and 7c show a third embodiment of the detector according to the invention, designed more especially to detect a wave guided in only one dimension.

FIG. 7a gives a schematic view of a third embodiment of the detector according to the invention, to detect a wave with the frequency $\nu_1$ guided in a single dimension, and according to the second alternative. The wave to be detected $h \cdot \nu_1$, is applied parallel to the plane of the layers forming the detector while the control wave $h \cdot \nu_2$ is applied in a direction perpendicular to these layers. This embodiment comprises an ohmic electrode E03, a layer 41, consisting of semiconducting material $M_b$, which is the substrate of the detector; a layer 42 consisting of material $M_a$; a layer 43 consisting of material $M_b$; a set of layers 44 constituting a quantum multiple well and comprising alternating layers of material $M_a$ and material $M_b$; a layer 45 consisting of material $M_a$; and a Schottky electrode ES3. The electrodes ES3 and E03 are respectively connected by terminals 46 and 40 to an electrical circuit comprising a generator G". The intensity of the current in this electrical circuit represents the optical power of the detected wave.

The layer 41 has high N-type doping to enable the obtaining of an ohmic contact to apply an electrical field through all the layers of the detector. The set of layers 44 has the same characteristics as the set of layers 22 in the preceding embodiment. Their doping is of the N-type and is as low as possible. Similarly, the layers 42, 43, 45, have an N-type doping which is as low as possible. The layers 42, 43, 45, especially, have the role of improving the confinement of the fundamental mode of the guide in all the layers 44 and of limiting the overlapping of the propagation of this mode with the substrate layer 41 and with the electrode ES3. Thus, the efficiency of the detector is increased and the propagation losses undergone by the fundamental mode are reduced. The layers 41, 42, 43 and 45 respectively have optical indices $N_1$, $N_2$, $N_3$ $N_5$ such that $N_2$ is equal to $N_5$ and ranges between $N_1$ and $N_3$ so as to confine the frequency $b_1$ wave more efficiently. The fundamental mode of the guide is chosen to propagate the wave to be detected for it is the best confined mode in the low-doped zone, especially in the set of layers 44. A graph superimposed on FIG. 7a indicates the distribution of energy propagated in this guiding structure as a function of the abscissa in the various layers of this structure.

Many alternative embodiments of the layers 45, 43, 42, located at both ends of the quantum multiple well, can be considered to form a guiding structure such that there is proper overlapping of the mode or modes of the wave to be detected $h \cdot \nu_1$ with the disturbance generated by the control wave $h \cdot \nu_2$ in each layer of material $M_b$ of the quantum multiple well. As a rule, the farthest two layers in the structure of the quantum multiple well have thicknesses chosen such that there is efficient overlapping.

When there is no control wave $h \cdot \nu_2$, the detector is practically transparent to the frequency $\nu_1$ wave, the only losses being due to absorption by the free carriers which are highly concentrated in the layer 41 of the substrate and in the metal forming the electrode ES3. The wave $h \cdot \nu_1$ then comes out parallel to the plane of the layers.

FIG. 7b shows a graph of the energy levels of the electrons in the conduction band for the different layers of this embodiment when no potential difference is applied between the terminals 40 and 46. The weak electrical field due to the Schottky electrode has been overlooked and is not shown. When there is no control wave $h \cdot \nu_2$, this quantum structure has several quantum wells for which the fundamental level $E_1$ in the conduction band is deserted.

FIG. 7c shows a graph of the energy levels of the electrons in the conduction band and the valence band through different layers of this embodiment, when a positive potential difference is applied to the terminal 40 with respect to the terminal 46 and when the detector is illuminated by the control wave. Under the effect of the control wave, the electrons leave the fundamental level $h_1$ of the valence band and will populate the fundamental level $e_1$ of the conduction band in each of the quantum wells of the set of layers 44. Under the effect of the wave to be detected, $h \cdot \nu_1$ the electrons populating the level $e_1$ transit to the continuum of unrelated states and are then shifted by the electrical field towards the electrode E03. The intensity of the current flowing in the electrical circuit represents the optical power of the detected wave. When there is no lighting, the fundamental level $e_1$ of the conduction band is deserted, the wave to be detected is not absorbed. It can go through the detector while remaining confined and can continue its path through an optical guide.

In one embodiment, the layers 42, 43, 45, are each 3 microns thick and the set of layers 44 is 1.5 microns thick, consisting of 50 wells, each created by a layer of material $M_b$ with a thickness of 0.006 microns and a layer of material $M_a$ with a thickness of 0.0024 microns. The materials $M_a$ and $M_b$ respectively consist of $Ga_{0.85}Al_{0.15}As$ and GaAs. The N-dopings of the layers 42, 43, 45, are $5.10^{14} cm^{-3}$. The N+doping of the layer 41 of the substrate is then $2.10^{18} cm^{-3}$. The optical indices are then equal to:

$N_3 = 3.27$
$N_2 = N_5 = 3.21$
$N_1 = 2.88$

This embodiment can be used to detect a medium infrared wave with a wavelength of 10.6 microns, with a control wave of a wavelength of 0.83 microns located in the near infrared range.

Figure 8:
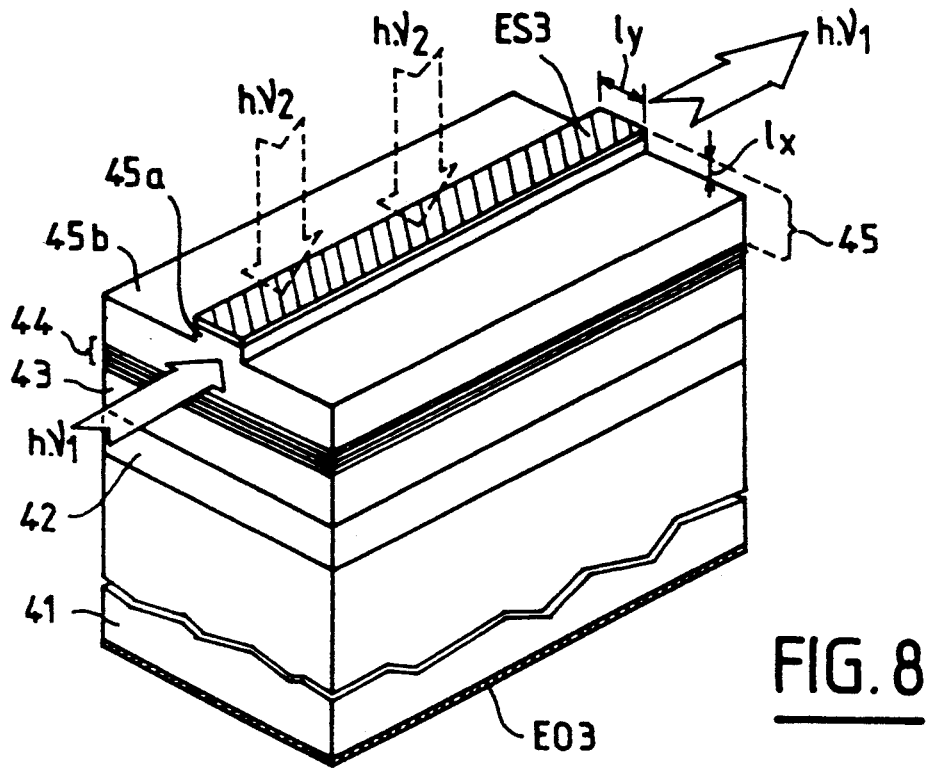
FIG. 8 shows a fourth embodiment intended more especially to detect a wave guided in two dimensions.

FIG. 8 gives a schematic view of a fourth embodiment of the detector according to the invention to detect a wave guided along two dimensions under the control of a wave with a frequency $\nu_2$. This embodiment is very close to the previous embodiment except for the layer 45 which has a flat rib 45a placed along its large axis of symmetry and parallel to the direction in which the wave to be detected is propagated. The rib 45a is got by a reduction $1_x$ in the thickness of the layer 45 on either side of the rib 45a. The layer 45 therefore has a flat part 45b on either side of the rib 45a. The width $1_y$ and thickness $1_x$ of the rib 45a are actually calculated by a standard procedure depending on the propagation modes desired in the guiding structure. The electrode ES3 covers only the surface of the rib 45a. The illumination by the control wave $h \cdot \nu_2$ is applied uniformly throughout the surface of this electrode ES3 perpendicularly to the plane of the layers. With a detector of this type, it is possible to make measurements of optical power in a section of a two-dimensional optical guide, in integrating it with this guide.

Figure 9:
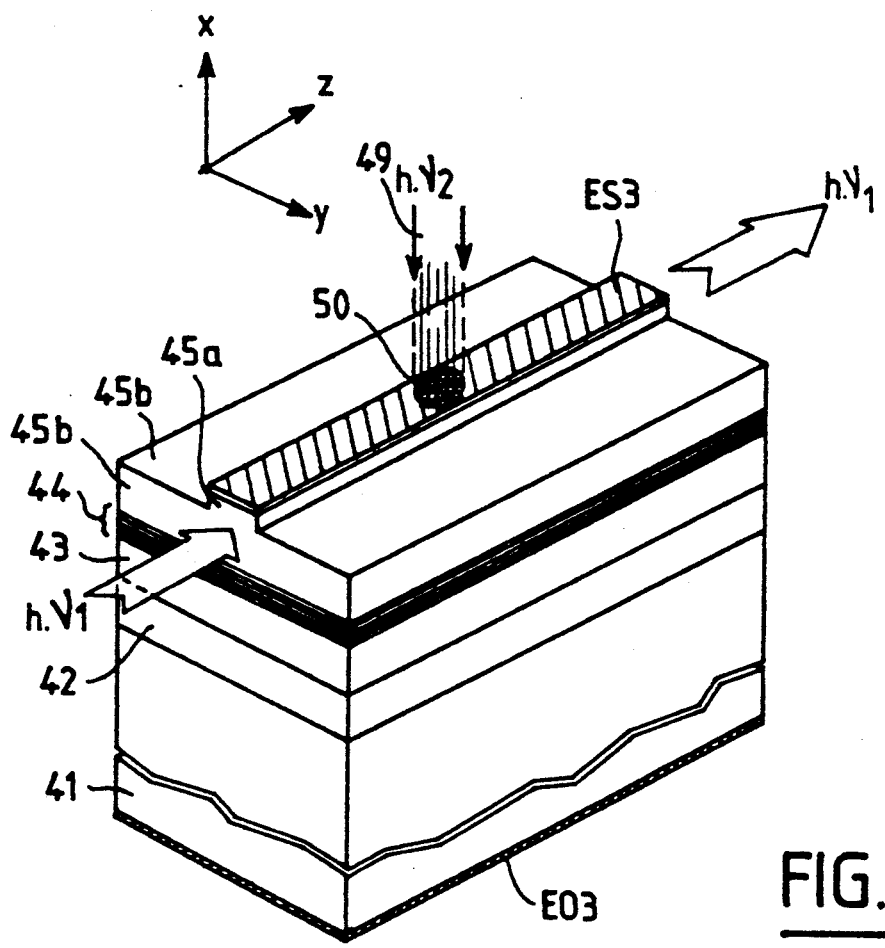
FIG. 9 shows the application of the fourth embodiment to the measurement of the optical power along a guide.

The above embodiment can be used also for a more localized measurement of the optical power propagated through a guide. As shown in FIG. 9, a measurement of the optical power through a very short guide section can be done by projecting a beam 49 of light at the frequency $\nu_2$ on a surface 50 having the width of the rib 45a and a length as small as possible to make a measurement practically in a section of the guide. By shifting the light beam along the rib 45a, it is possible to measure the variations in optical power along the guide. It is possible, for example, to determine the propagation losses undergone by a considered mode within this guide.

Figure 10:
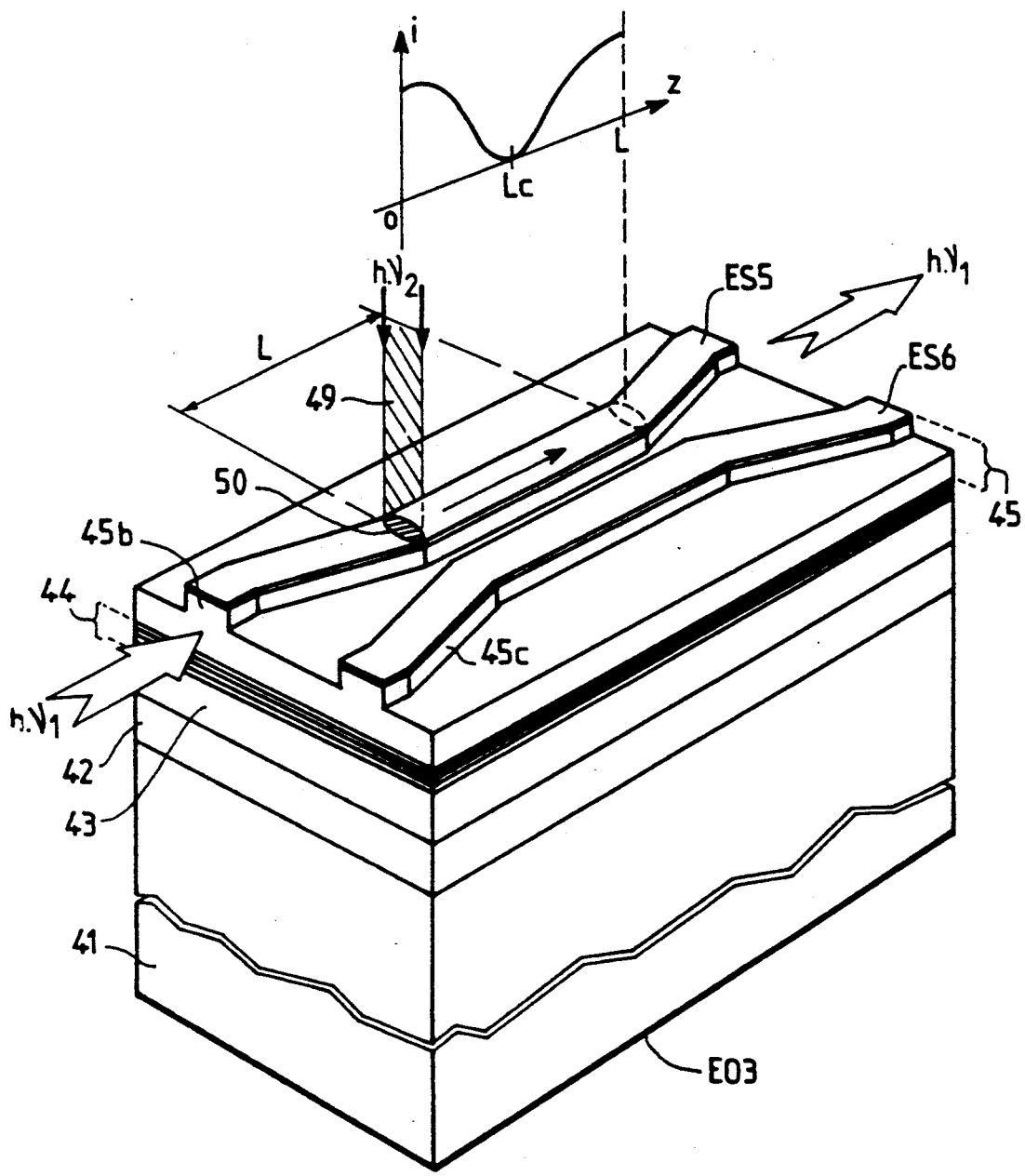
FIG. 10 shows the application of the fourth embodiment to the measurement of the optical power along an optical coupler.

Similarly, this measuring method can be used to determine the coupling length of a directional coupler. FIG. 10 shows the use of the detector according to the invention to measure the length of the coupling of a directional coupler. A coupler of this type has two monomode guides which are fairly close to each other, along a distance L, called an interaction length, for which there is a coupling between the two guides. This coupling is represented by a periodic exchange of optical energy between the two guides and this exchange is total when the structure is perfectly symmetrical.

As shown in FIG. 10, the two guides are modified to incorporate a detector with a structure similar to that shown in FIG. 8. The two coupled guides are manufactured by thinning the layer 45 to create two ribs 45b and 45c comprising a segment where they are parallel and very close on a length L. They are each coated with an electrode, ES5 and ES6 respectively, to collect a measurement current. A beam 49 of light at a frequency of $\nu_2$ illuminates a small surface 50 of the guide consisting of the rib 45b, the small surface 50 having a width equal to that of the rib 45b and a length as small as possible to obtain a measurement practically in a section of the guide. The beam 49 is shifted along the guide in the path forming the coupler. The graph shows the variation in the intensity i of the current collected by the electrode ES5 as a function of the ascissa z along the guide. This current passes through a minimum for the abscissa $L_c$ corresponding to L/2.

The scope of the invention is not limited to the two embodiments described above. Several alternative embodiments are within the scope of those skilled in the art, by modifying the choice of materials to detect a wave with a wavelength belonging to a different range or else to use a control wave belonging to a different range of wavelength. It is also possible for those skilled in the art to make other structures of optical guides incorporating the detector according to the invention.

The invention can be applied especially to integrated guided optics.

What is claimed is:

1. An apparatus for detecting an electromagnetic wave having a frequency $\nu_1$, said apparatus comprising:
   at least one first layer of semiconductive material of a first type which is crossed said wave;
   at least two second layers, each first layer being placed between two second layers and these second layers consisting of a semiconducting material of a second type, these two types of material being such that there is a potential wall in the conduction band and in the valence band of each first layer; the thickness of each first layer being such that the electrons of the conduction band of each first layer have at least one permitted discrete level of energy such that the difference in energy between this layer and the bottom of the conduction band in the second layers is smaller than or equal to the energy corresponding to the frequency $\nu_1$ of said electromagnetic wave; said level being populated by electrons;
   two electrodes to apply an electrical field to all the first and second layers and to collect an electrical current depending on the amplitude of said wave;
   wherein the first and second layers have a doping which is as low as possible and wherein, the conduction band of each first layer has a fundamental discrete level which is populated with electrons, said apparatus further comprising a means for generating a control wave for illuminating said conduction band of each first layer wherein said control wave has a frequency $\nu_2$ close to the frequency $\nu_2 0$ corresponding to the energy difference between the fundamental level permitted for the holes in the valence band and the fundamental level permitted for the electron in the conduction band of the material of the first type.

2. A detector according to claim 1, wherein the two electrodes are transparent to the frequency $\nu_1$ of the wave to be detected.

3. An apparatus for detecting an electromagnetic wave having a frequency $\nu_1$, said apparatus comprising:
   at least one first layer of semiconductive material of a first type which si crossed by the wave;
   at least two second layers, each first layer being placed between two second layers and these second layers consisting of a semiconducting material of a second type, these two types of material being such that there is a potential well in the conduction band and in the valence band of each fist layer; the thickness of each first layer being such that the electrons of the conduction band of each fist layer have at least one permitted discrete level of energy such that the difference in energy between this layer and the bottom of the conduction band in the second layers is smaller tan or equal to the energy corresponding to the frequency $\nu_1$ of said wave; said level being populated by electrons;

two electrodes to apply an electrical field to all the first and second layers and to collect an electrical current depending on the amplitude of said wave;

wherein said apparatus detects said wave guided along a single dimension, wherein the first and second layers are plane layers; wherein the guided wave is propagated through the first and second layers parallel to their plane; wherein the total thickness of these layers and their indices are such that they can guide at least one mode of the range of frequencies of th wave to be detected; and wherein said apparatus includes a means for generating a control wave and wherein the thickness of the furthest second layers is such that there is proper overlapping of the mode or modes of said wave with a disturbance generated by said control electromagnetic wave in each fist layer.

4. An apparatus for detecting an electromagnetic wave having a frequency $\nu_1$, said apparatus comprising:

at least one first layer of semiconductive material of a first type which is crossed by said wave;

at least two second layers, each fist layer being placed between two second layers and these second layers consisting of a semiconducting material of a second type, these two types of material being such that there is a potential wall in the conduction band and in the valence band of each fist layer; the thickness of each first layer being such that the electrons of the conduction band of each first layer have at lest on permitted discrete level of energy such that the difference in energy between this layer and the bottom of the conduction band in the second layers is smaller than or equal to the energy corresponding to the frequency $\nu_1$ of said wave; said level being populated by electrons;

two electrodes to apply an electrical field to all the first and second layers and to collect an electrical current depending on the amplitude of the wave to be detected;

wherein said apparatus detects said wave in two dimensions, wherein the first and second layers are plane layers; said wave is propagated through the first and the second layers parallel to their plane; the total thickness of said first and second layers and the indices of said first and second layers re such that that provide for the guiding of at least one mode of the range of frequencies as said wave, and the second layer which si the layer closest to the surface has a non-uniform thickness, said layer closest to the surface includes uniform reduced thickness areas on either side of a rib portion the large axis of said rib portion corresponding to the direction of propagation of said wave and the reduction of thickness being chosen as a function of the desired modes of propagation.

5. An apparatus for detecting an electromagnetic wave having a frequency $\nu_1$, said apparatus comprising:

at least one first layer of semiconductive material of a first type which is crossed by said wave;

at least two second layers, each first layer being placed between two second layers and these second layers consisting of a semiconducting material of a second type, these two types of material being such that there is a potential well in the conduction band and in the valence and of each first layer; the thickness of each first layer being such that the electrons of the conduction band of each first layer have at least one permitted discrete level of energy such that the difference in energy between this layer and the bottom of the conduction band in the second layers is smaller than or equal to the energy corresponding to the frequency $\nu_1$ of said wave; said level being populated by electrons;

two electrodes to apply an electrical field to all the first and second layers and to collect an electrical current depending on the amplitude of said wave;

wherein said wave is a carrier of an image which is projected on the plane of the first and second layers; and comprising means to generate a control wave wherein said control wave is projected on the plane of the first and second layers by illuminating a surface which is mall as compared with the total surface of the detector, and by scanning the entire surface of the detector in a predetermined path.

* * * * *